(12) United States Patent
Yang et al.

(10) Patent No.: US 7,694,727 B2
(45) Date of Patent: Apr. 13, 2010

(54) HEAT DISSIPATION DEVICE WITH MULTIPLE HEAT PIPES

(75) Inventors: Ping-An Yang, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 404 days.

(21) Appl. No.: 11/626,159

(22) Filed: Jan. 23, 2007

(65) Prior Publication Data
US 2008/0173431 A1     Jul. 24, 2008

(51) Int. Cl.
*F28D 15/00* (2006.01)
*H05K 7/20* (2006.01)
*H01L 23/34* (2006.01)

(52) U.S. Cl. .................. 165/104.33; 361/700; 257/715
(58) Field of Classification Search ............ 165/104.33; 361/700; 257/715
See application file for complete search history.

(56) References Cited

U.S. PATENT DOCUMENTS

| 5,896,922 | A | * | 4/1999 | Chrysler et al. ............. 165/165 |
| 6,321,452 | B1 | | 11/2001 | Lin |
| 6,625,021 | B1 | * | 9/2003 | Lofland et al. .............. 361/697 |
| 6,651,732 | B2 | | 11/2003 | Sagal |
| 7,451,806 | B2 | * | 11/2008 | Zhou et al. ............. 165/104.33 |
| 7,493,939 | B2 | * | 2/2009 | Xia et al. ................ 165/104.26 |
| 2007/0000646 | A1 | * | 1/2007 | Chen et al. ............. 165/104.33 |
| 2007/0215321 | A1 | * | 9/2007 | Yang et al. .................. 165/80.3 |
| 2008/0093052 | A1 | * | 4/2008 | Yang et al. .................. 165/80.3 |
| 2008/0289798 | A1 | * | 11/2008 | Min et al. ................... 165/80.3 |
| 2008/0314554 | A1 | * | 12/2008 | Li ............................... 165/80.3 |
| 2009/0000768 | A1 | * | 1/2009 | Zheng et al. ................ 165/80.3 |
| 2009/0008065 | A1 | * | 1/2009 | Jin et al. ................. 165/104.33 |
| 2009/0016023 | A1 | * | 1/2009 | Cao et al. .................... 361/702 |
| 2009/0266513 | A1 | * | 10/2009 | Xiong et al. ............... 165/80.3 |

FOREIGN PATENT DOCUMENTS

| CN | 2665919 Y | 12/2004 |
| CN | 2746530 Y | 12/2005 |

* cited by examiner

*Primary Examiner*—Cheryl J Tyler
*Assistant Examiner*—Brandon M Rosati
(74) *Attorney, Agent, or Firm*—Frank R. Niranjan

(57) ABSTRACT

A heat dissipation device includes a base for contacting an electronic device. Two first heat pipes are arranged on and thermally engaged with the base for absorbing heat from the electronic device and spread the heat to the base. Each of the two first heat pipes is sinuous and defines two U-shaped portions on the base. Two second heat pipes are thermally engaged with the base for absorbing heat from the electronic device and spreading the heat to the base. Each of the two second heat pipes has a first section located at a corresponding one of the two U-shaped portions on the base. A fin set is located on the base for dissipating heat in the base to ambient air.

16 Claims, 7 Drawing Sheets

HEAT DISSIPATION DEVICE WITH MULTIPLE HEAT PIPES

BACKGROUND OF THE INVENTION

1. Field of the Invention

The present invention relates to heat dissipation devices for use in removing heat from electronic devices, and more particularly to a heat dissipation device incorporating heat pipes for improving heat dissipation efficiency of the heat dissipation device.

2. Description of Related Art

During operation of an electronic device such as a computer central processing unit (CPU) mounted on a printed circuit board, a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device comprises a solid metal base attached on the CPU, and a plurality of fins arranged on the base. The base is intimately attached to the CPU thereby absorbing the heat generated by the CPU. Most of the heat accumulated at the base is transferred firstly to the fins and then dissipates away from the fins. However, as electronics technology continues to advance, increasing amounts of heat are being generated by powerful state-of-the-art CPUs. As a result, many conventional heat dissipation devices are no longer able to efficiently remove heat from these CPUs.

In order to overcome the above set out problems, a type of heat dissipation device illustrated as follows can be used. The heat dissipation device comprises a base for absorbing heat from a heat generating electronic device, a heat pipe thermally combined to the base, and a plurality of fins arranged on the base. Generally, the heat pipe is linear. The base defines a corresponding groove substantially in a center thereof receiving the heat pipe therein. In use, the base contacts the electronic device and absorbs heat from the electronic device. The heat in the base is absorbed by the heat pipe, and the heat pipe transfers the heat from the center to other parts of the base. The heat in the base spreads to the fins to be dissipated to ambient air. However, the heat pipe is straight, which results in a thermal contact area between the base and the heat pipe is considerably small. Consequently, the heat in the center of the base cannot be transmitted to other parts of the base rapidly and evenly. The heat generated by the electronic device accumulates in the center of the base and the electronic device. Normal functions and abilities of the electronic device are adversely affected. Therefore, the heat dissipation device needs to be improved.

What is needed, therefore, is a heat dissipation device has a large heat dissipation capacity for an electronic device.

SUMMARY OF THE INVENTION

A heat dissipation device in accordance with a preferred embodiment of the present invention is used for dissipating heat generated by an electronic device. The heat dissipation device comprises a base for contacting the electronic device. Two first heat pipes are juxtaposed and thermally engaged with the base for absorbing heat from the electronic device and spreading the heat to the base. Each of the two first heat pipes is sinuous and defines two U-shaped portions on the base. Two second heat pipes are thermally engaged with the base for absorbing heat from the electronic device and spreading the heat to the base. Each of the two second heat pipes has a first section located at a corresponding one of the two U-shaped portions on the base. A fin set is located on the base for dissipating heat in the base to ambient air.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
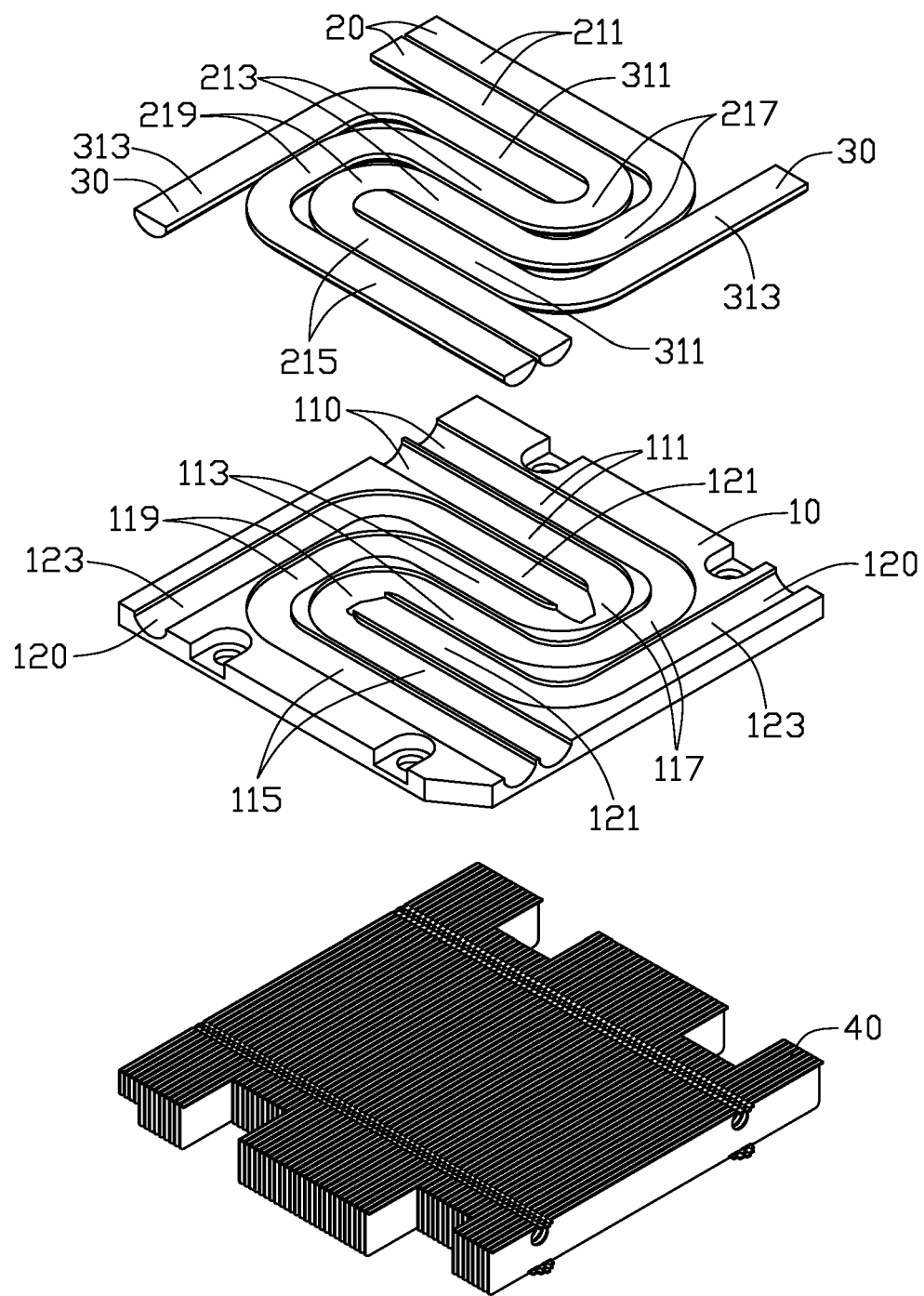
FIG. 1 is an inverted, exploded, isometric view of a heat dissipation device in accordance with a first embodiment of the present invention.
Figure 2:
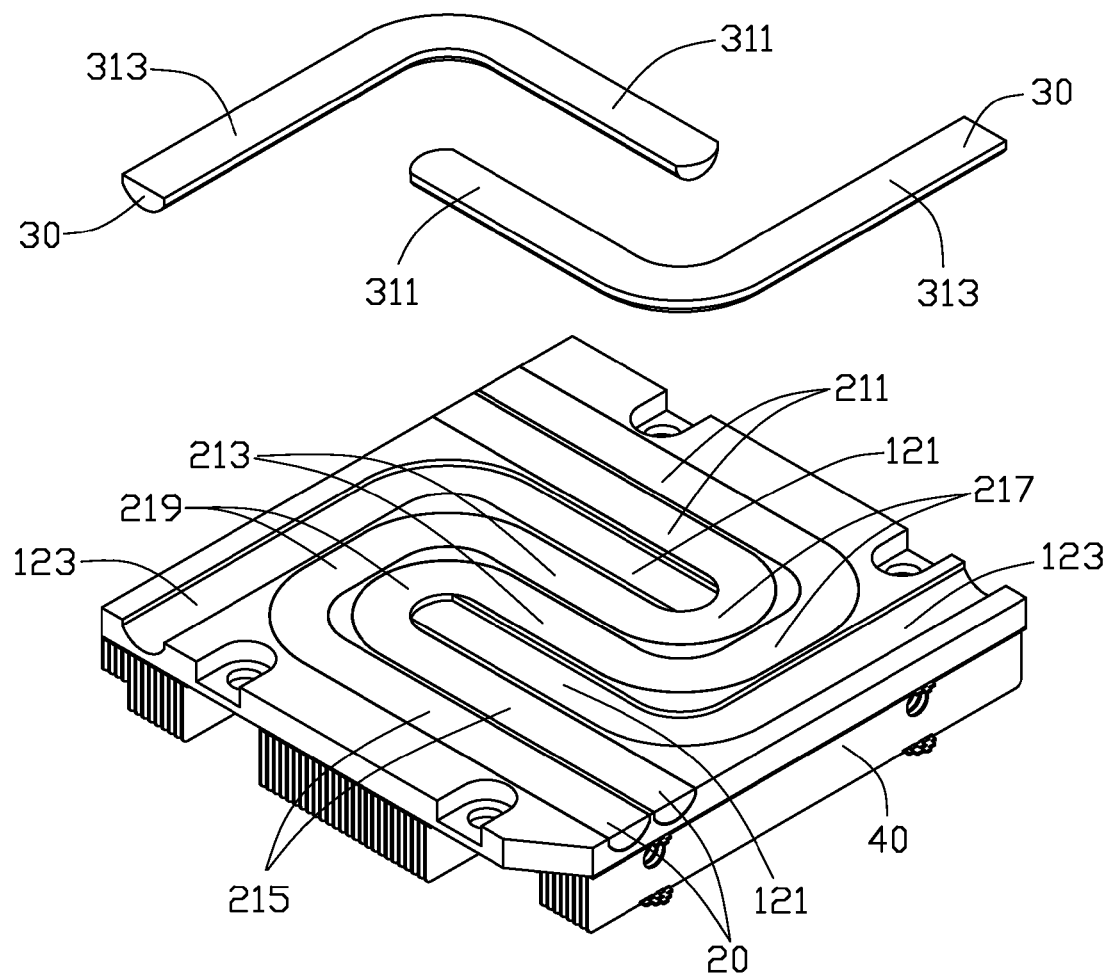
FIG. 2 is a partially assembled view of FIG. 1.
Figure 3:
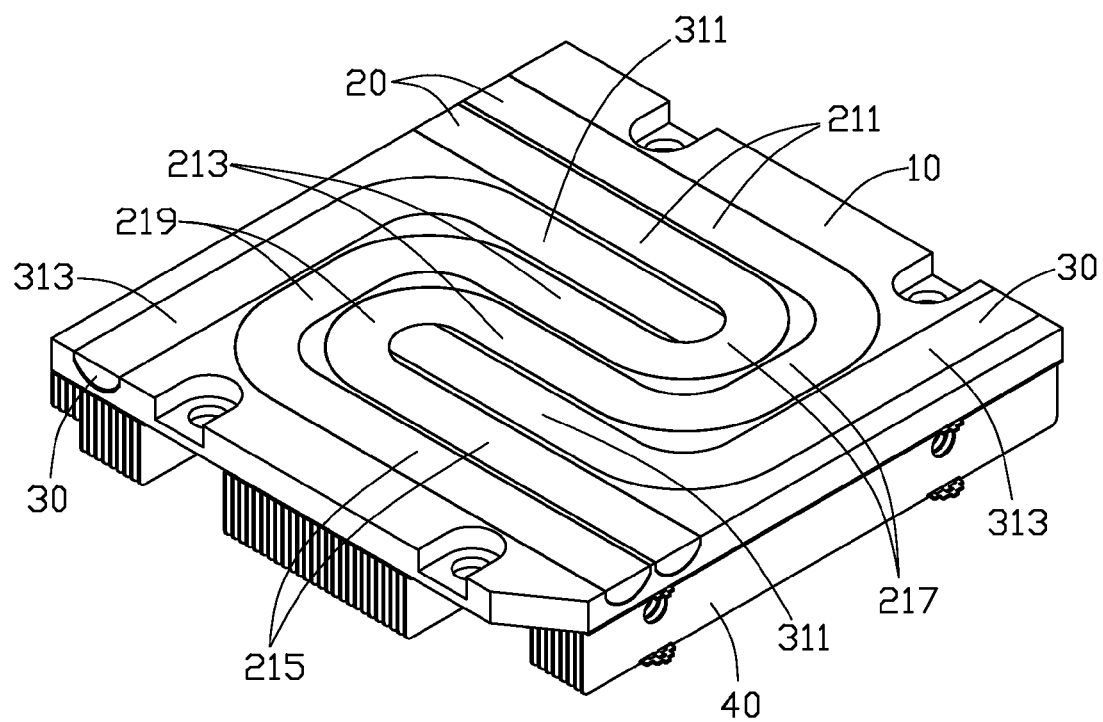
FIG. 3 is an assembled view of FIG. 2.

Referring to FIGS. 1-3, a heat dissipation device in accordance with a first embodiment of the present invention is used for dissipating heat generated by an electronic device (not shown) located on a printed circuit board (not shown). The heat dissipation device comprises a base 10, two first heat pipes 20 thermally engaged with the base 10, two second heat pipes 30 thermally engaged with the base 10, and a fin set 40 thermally in contact with the base 10.

The base 10 is a substantially rectangular metal plate having good heat conductivity, and has a bottom face (not labeled) for contacting the electronic device and a top face (not labeled) opposite to the bottom face. Two first grooves 110 and two second grooves 120 are defined in the bottom face of the base 10. The two first grooves 110 are defined parallel in the base 10 and have the same extension direction. Each first grooves 110 is substantially S-shaped, and comprises parallel first, second, third linear portions 111, 113, 115 and first, second connecting portions 117, 119 connecting adjacent first, second, third linear portions 111, 113, 115. The first linear portion 111 of each first groove 110 is located at a lateral portion of the base 10. The second linear portion 113 of each first groove 110 is substantially located at a middle portion of the base 10. The third linear portion 115 of each first groove 110 is located at an opposite lateral portion to the first linear portion 111 of the base 10. The first connecting portion 117 of each first groove 110 connects the first and second linear portions 111, 113. The second connecting portion 119 of each first groove 110 connects the second and third linear portions 113, 115. The first and second connecting portions 117, 119 of each first groove 110 are located at two opposite lateral portions of the base 10. Each of the two second grooves 120 is substantially L-shaped, and comprises a first portion 121 and a second portion 123 perpendicular to the first portion 121. The first portion 121 of one second groove 120 is located between the first linear portion 111 and the second linear portion 113 of the first groove 110, the second portion 123 of the one second groove 120 is located outside the second connecting portions 119 of the first grooves 110 in the base 10. The first portion 121 of the other second groove 120 is located between the second portion 113 and the third portion 115 of the first groove 110, the second portion 123 of the other second groove 120 is located outside the first connecting portions 117 of the first grooves 110. The first portions 121 of the second grooves 120 are parallel to the first, second, third linear portions 111, 113, 115 of the first heat pipes 110. The second portions 123 of the second grooves 120 are substantially parallel to the first, second connecting portions 117, 119 of the first grooves 110.

The fin set 40 comprises two groups of fins (not labeled) disposed in alternating fashion on the top face of the base 10. Each group of fins comprises a plurality of fins assembled together. The fins of different groups are of different length.

Each first heat pipe 20 is substantially S-shaped in profile, and comprises three parallel sections: a first linear section 211, a second linear section 213, a third linear section 215; the first heat pipe 20 further comprises a first connecting section 217 connecting the first, second linear sections 211, 213, and a second connecting section 219 connecting the second, third linear sections 213, 215. In this case, the first, second connecting sections 217, 219 can be arc-shaped or linear depending on distances between the first, second, third linear sections 211, 213, 215. Each second heat pipe 30 is substantially L-shaped, and comprises a first linear section 311 and a second linear section 313 perpendicular to the first linear section 311. A rounder corner is formed at a joint of the first linear section 311 and the second linear section 313. In this case, the first heat pipes 20 each have a semicircular cross section. The second heat pipes 30 each have a semicircular cross section.

The first, second heat pipes 20, 30 are thermally received in corresponding first, second grooves 110, 120 in the bottom face of the base 10, wherein the first, second, third linear sections 211, 213, 215, and the first, second connecting sections 217, 219 of the first heat pipes 20 are each thermally engaged in their respective corresponding first, second, third linear portions 111, 113, 113, and the first, second connecting sections 117, 119 of the first grooves 110 of the base 10. The first, second linear sections 311, 313 of the second heat pipes 30 are thermally engaged in the first, second linear portions 121, 123 of the second grooves 120 of the base 10. The first linear section 311 of one of the second heat pipes 30 is located between the first, second linear sections 211, 213 of the first heat pipes 20, and the second linear section 313 thereof is located outside the second connecting section 219 of the first heat pipes 20 on the base 10. The first linear section 311 of the other second heat pipe 30 is located between the second, third linear sections 213, 215 of the first heat pipes 20, and the second linear section 313 thereof is located outside the first connecting sections 217 of the first heat pipes 20 on the base 10. The first, second, third linear sections 211, 213, 215 of the first heat pipes 20 and the first linear sections 311 of the second heat pipes 30 are aligned parallel on the base 10. The first, second connecting sections 217, 219 of the first heat pipes 20 and the second linear sections 313 of the second heat pipes 30 are aligned parallel on the base 10. In this case, in the bottom face of the base 10, the first, second heat pipes 20, 30 are coplanar with the base 10 and substantially bestrew most of the bottom face of the base 10.

In use, the base 10 has the bottom face thermally contacting the electronic device with the first, second heat pipes 20, 30 thermally contacting the electronic device. The first, second heat pipes 20, 30 absorb heat from the electronic device. The heat in the first, second heat pipes 20, 30 is quickly transmitted to all parts of the base 10 by the sections of the first, second heat pipes 20, 30. The heat in the base 10 is transmitted to the fin set 30 and is then dissipated to ambient air.

According to the first embodiment of the present invention, the first, second heat pipes 20, 30 cover most of the bottom face of the base 10 and spread heat from the electronic device to all parts of the base 10 rapidly. Therefore, the heat generated by the electronic device is evenly distributed to the base 10 by the first, second heat pipes 20, 30 rapidly and is transmitted to the fin set 40 to be dissipated to the ambient air. In comparison with the related art, heat dissipation capacity of the heat dissipation device of the present invention is improved greatly.

Figure 4:
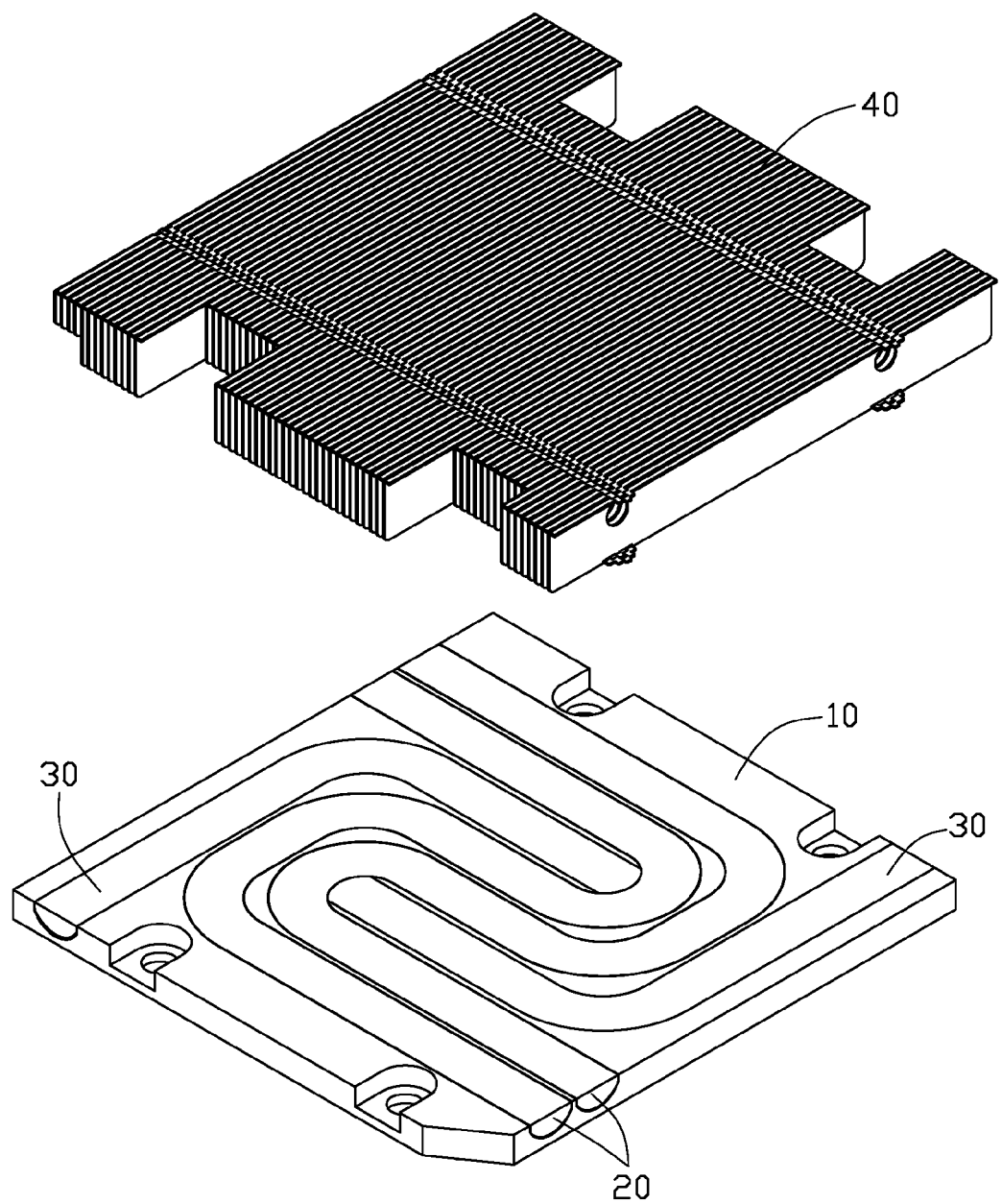
FIG. 4 is a partially exploded, isometric view of a heat dissipation device in accordance with a second embodiment of the present invention.

Referring to FIG. 4, a heat dissipation device in accordance with a second embodiment of the present invention is shown. The heat dissipation device is similar to the first embodiment of the present invention; a difference therebetween is that the first, second heat pipes 20, 30 of this case are thermally engaged in the top face of the base 10. The fin set 40 thermally contacts the first, second heat pipes 20, 30 and the top face of the base 10.

Figure 5:
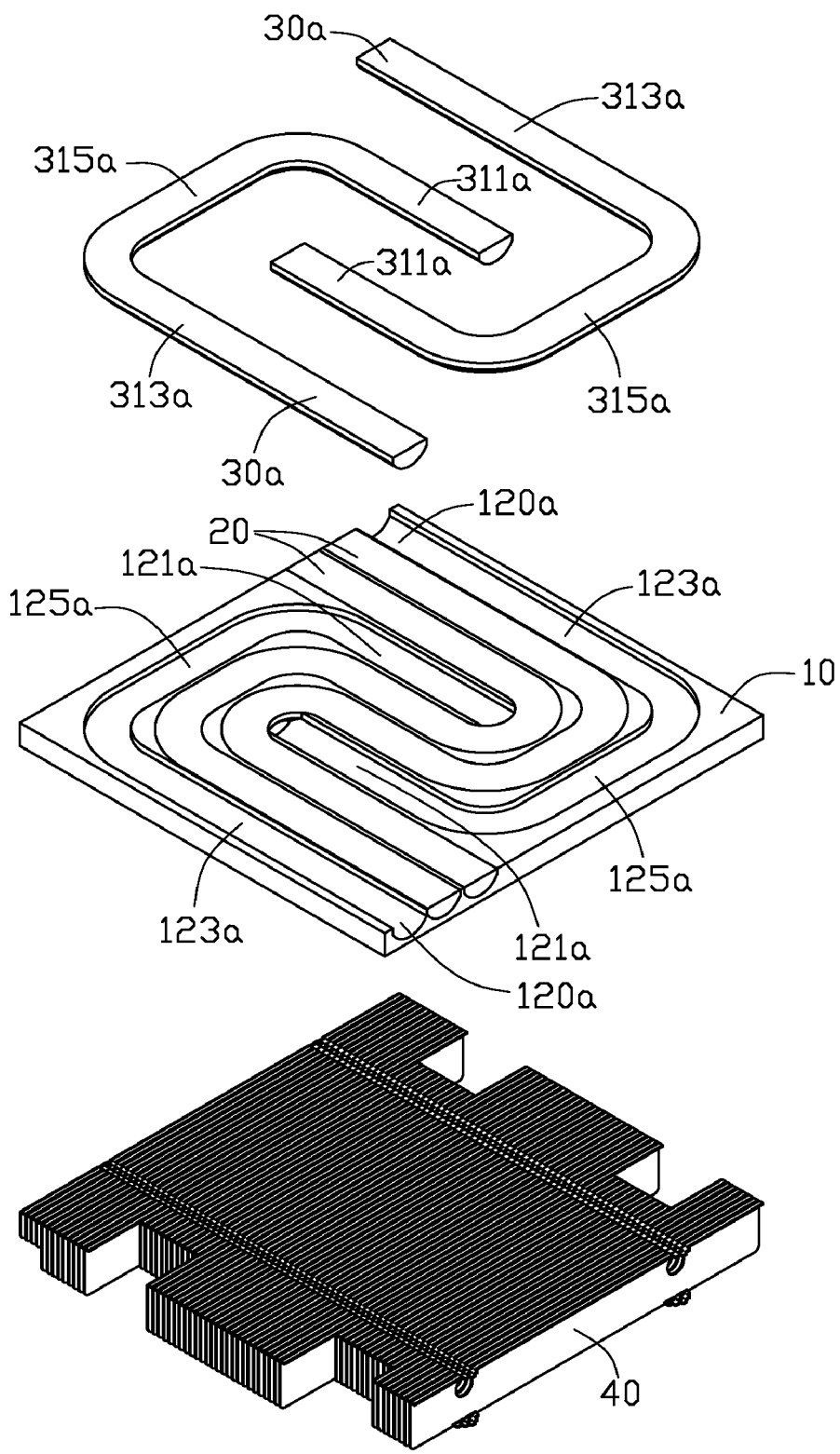
FIG. 5 is an inverted, partially exploded, isometric view of a heat dissipation device in accordance with a third embodiment of the present invention.
Figure 6:
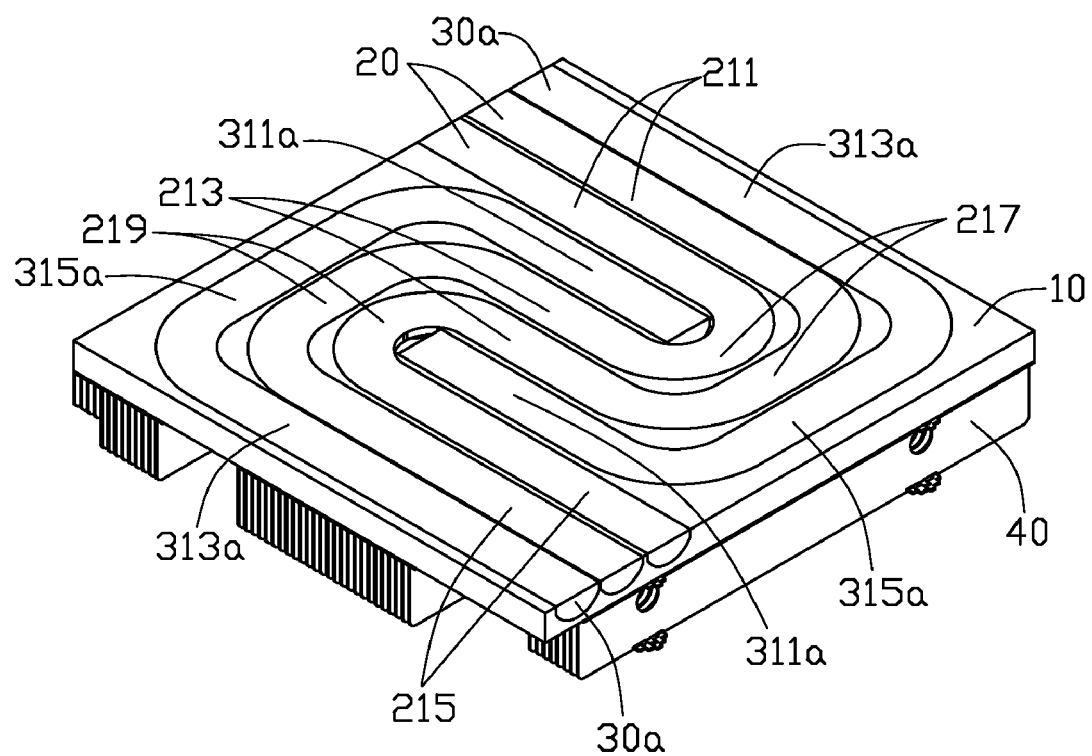
FIG. 6 is an assembled view FIG. 5.

Referring to FIGS. 5 and 6, the heat dissipation device in accordance with a third embodiment of the present invention is shown. The heat dissipation device is similar to the first embodiment of the present invention, a difference being that two second heat pipes 30a of this case are each substantially U-shaped to replace the two L-shaped second heat pipes 30 of the first embodiment. The base 10 defines two U-shaped second grooves 120a to replace the two L-shaped second grooves 120 of the first embodiment to receive the two second heat pipes 30a therein. Each second groove 120a comprises a first portion 121a, a second portion 123a and a connecting portion connecting the first portion 121a and the second portion 123a. The second heat pipe 30a comprises a first linear section 311a, a second linear section 313a substantially parallel to the first linear section 311a and a connecting section 315a connecting the first linear section 311a and the second linear section 313a. The first section 311a of one of the second heat pipes 30a is located between the first, second linear sections 211, 213 of the first heat pipes 20, the second linear section 313a thereof is located outside the third linear sections 215 of the first heat pipes 20, and the connecting section 315a thereof is located outside the second connecting sections 219 of the first heat pipes 20. The first section 311a of the other of the second heat pipes 30a is located between the second, third linear sections 213, 215 of the first heat pipes 20, the second linear section 313a thereof is located outside the first linear sections 211 of the first heat pipes 20, and the connecting section 315a thereof is located outside the first connecting sections 217 of the first heat pipes 20.

Figure 7:
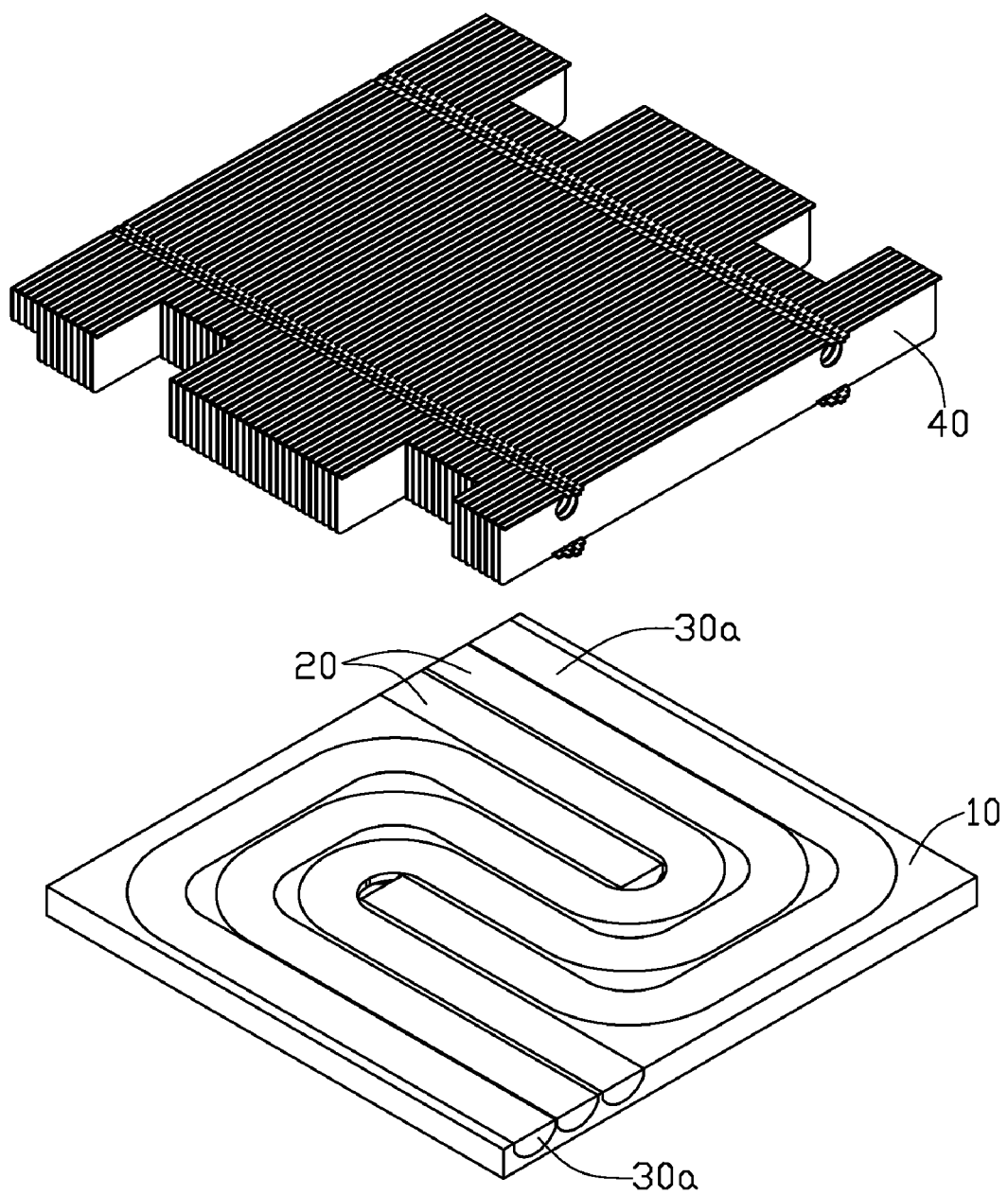
FIG. 7 is an partially exploded, isometric view of a heat dissipation device in accordance with a fourth embodiment of the present invention.

Referring to FIG. 7, a heat dissipation device in accordance with a fourth embodiment of the present invention is shown. The heat dissipation device is similar to the third embodiment of the present invention, a difference being that the first, second heat pipes 20, 30a of this case are thermally engaged in the top face of the base 10. The fin set 40 thermally contacts the first, second heat pipes 20, 30a and the top face of the base 10.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a heat generating electronic device, the heat dissipation device comprising:
   a base for contacting with the electronic device;
   two first heat pipes being arranged on the base and thermally engaged with the base, each of the two heat pipes being sinuous and forming two U-shaped portions on the base;
   two second heat pipes thermally engaged with the base, each of the two second heat pipes comprising a first section located in corresponding one of the two U-shaped portions of the first heat pipes on the base; and
   a fin set thermally contacting the base for dissipating the heat in the base.

2. The heat dissipation device of claim 1, wherein each of the first heat pipes comprises a first linear section located at a lateral portion of the base, a second linear section located at a middle portion of the base, a third linear section located at an opposite lateral portion of the base.

3. The heat dissipation device of claim 2, wherein the first linear section, the second linear section, the third linear section of each of the first heat pipes are parallel to each other.

4. The heat dissipation device of claim 3, wherein each of the first heat pipes comprises a first connecting section connecting the first linear section and the second linear section thereof, and a second connecting section connecting the second linear section and the third linear section thereof, the first connecting sections of the two first heat pipes located at a lateral portion of the base, the second connecting sections located at an opposite lateral portion of the base.

5. The heat dissipation device of claim 4, wherein the each of the first heat pipes is S-shaped in profile.

6. The heat dissipation device of claim 4, wherein the first section of one of the two second heat pipes is located between the first linear sections and the second linear sections of two first heat pipes on the base, the first sections of the other of the two second heat pipes are located between the second linear sections and the third linear sections of the two first heat pipes on the base.

7. The heat dissipation device of claim 6, wherein the two second heat pipes each comprise a second section located outside a corresponding one of the first, second connecting sections of the two first heat pipes.

8. The heat dissipation device of claim 7, wherein the two second heat pipes each are substantially L-shaped in profile.

9. The heat dissipation device of claim 7, wherein the two second heat pipes each comprise a third section located outside a corresponding one of the first, third linear sections of the two first heat pipes.

10. The heat dissipation device of claim 9, wherein the two second heat pipes each are substantially U-shaped in profile.

11. The heat dissipation device of claim 1, wherein the first heat pipes and the second heat pipes are located at a face of the base, the fin set is located at an opposite face of the base.

12. The heat dissipation device of claim 1, wherein the first heat pipes and the second heat pipes are coplanar with a face of the base.

13. A heat dissipation device for dissipating heat generated by an electronic device, the heat dissipation device comprising:
    a base for contacting the electronic device;
    two first heat pipes thermally engaged with the base for absorbing heat from the electronic device and spreading the heat to the base, each of the two first heat pipes being sinuous and defining two U-shaped portions on the base;
    two second heat pipes thermally engaged with the base for absorbing heat from the electronic device and spreading the heat to the base, each of the two second heat pipes having a first section located at a corresponding one of the two U-shaped portions on the base; and
    a fin set located on the base for dissipating heat in the base to ambient air.

14. The heat dissipation device of claim 13, wherein each of the two first heat pipes is substantially S-shaped on the base.

15. The heat dissipation device of claim 14, wherein each of the second heat pipes is substantially L-shaped on the base.

16. The heat dissipation device of claim 14, wherein each of the second heat pipes is substantially U-shaped on the base.

* * * * *